United States Patent [19]

Carter et al.

[11] Patent Number: 5,710,742
[45] Date of Patent: Jan. 20, 1998

[54] HIGH DENSITY TWO PORT SRAM CELL FOR LOW VOLTAGE CMOS APPLICATIONS

[75] Inventors: Eric Lee Carter; Roger Paul Gregor; Moon Ho Lee, all of Endicott, N.Y.; Michael Richard Ouellette, Westford, Vt.

[73] Assignee: International Business Machines Corporation, Armonk, N.Y.

[21] Appl. No.: 440,285

[22] Filed: May 12, 1995

[51] Int. Cl.[6] .................................................. G11C 11/00
[52] U.S. Cl. .............................. 365/230.05; 365/189.05; 365/154
[58] Field of Search ................. 365/230.05, 189.05, 365/154, 49

[56] References Cited

U.S. PATENT DOCUMENTS

| | | | |
|---|---|---|---|
| 4,719,596 | 1/1988 | Bernstein et al. | 365/189.04 |
| 4,764,899 | 8/1988 | Lewallen et al. | 365/189.4 |
| 5,034,924 | 7/1991 | Taniguchi et al. | 365/189 |
| 5,068,852 | 11/1991 | Mahant-Shetti et al. | 365/154 |
| 5,260,908 | 11/1993 | Ueno | 365/230.05 |
| 5,282,174 | 1/1994 | Little | 365/230.05 |
| 5,287,323 | 2/1994 | Takahashi et al. | 365/230.05 |
| 5,289,432 | 2/1994 | Dhong et al. | 356/230.05 |
| 5,299,158 | 3/1994 | Mason et al. | 365/189.04 |
| 5,307,322 | 4/1994 | Usami et al. | 365/230.05 |
| 5,317,536 | 5/1994 | Aoyama | 365/189.24 |
| 5,327,372 | 7/1994 | Oka et al. | 365/49 |
| 5,335,199 | 8/1994 | Aoyama | 365/230.05 |
| 5,396,449 | 3/1995 | Atallah et al. | 365/49 |
| 5,469,380 | 11/1995 | Iio | 365/154 |

*Primary Examiner*—David C. Nelms
*Assistant Examiner*—Vu A. Le
*Attorney, Agent, or Firm*—Eugene I. Shkurko

[57] ABSTRACT

A two-port memory cell design which permits simultaneous reading and writing of cells which are on the same wordline but on different Bit Select lines without increase in Read Access Time, and while maintaining memory functionality at low voltages. The memory cell uses a standard 6 transistor design to provide a differential read for fast access plus another three transistors are added to each cell to provide a means of differentially writing the cell and de-gating the write if the bit-select is not active. This cell design has applicability to multi-port memories as well.

18 Claims, 11 Drawing Sheets

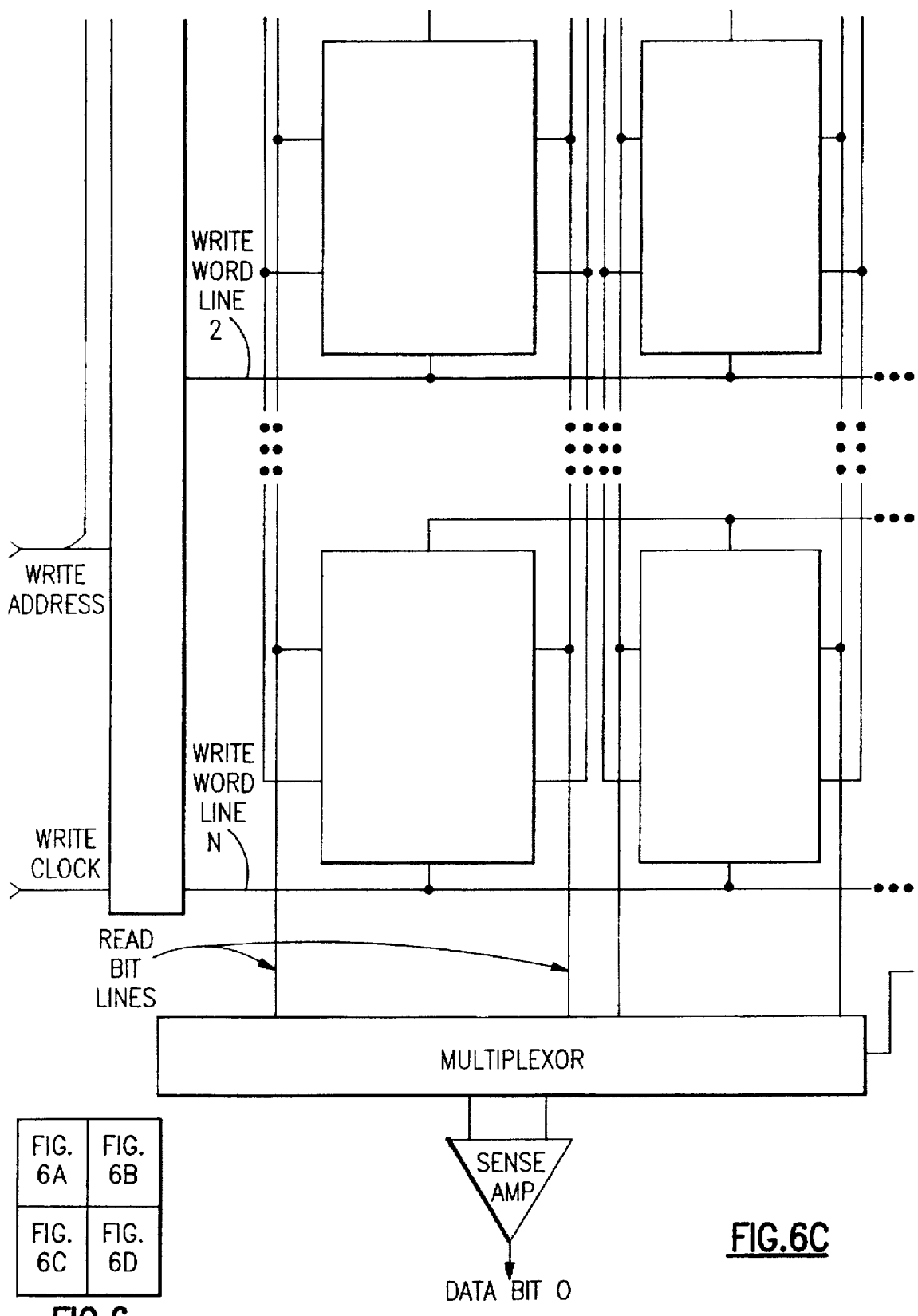

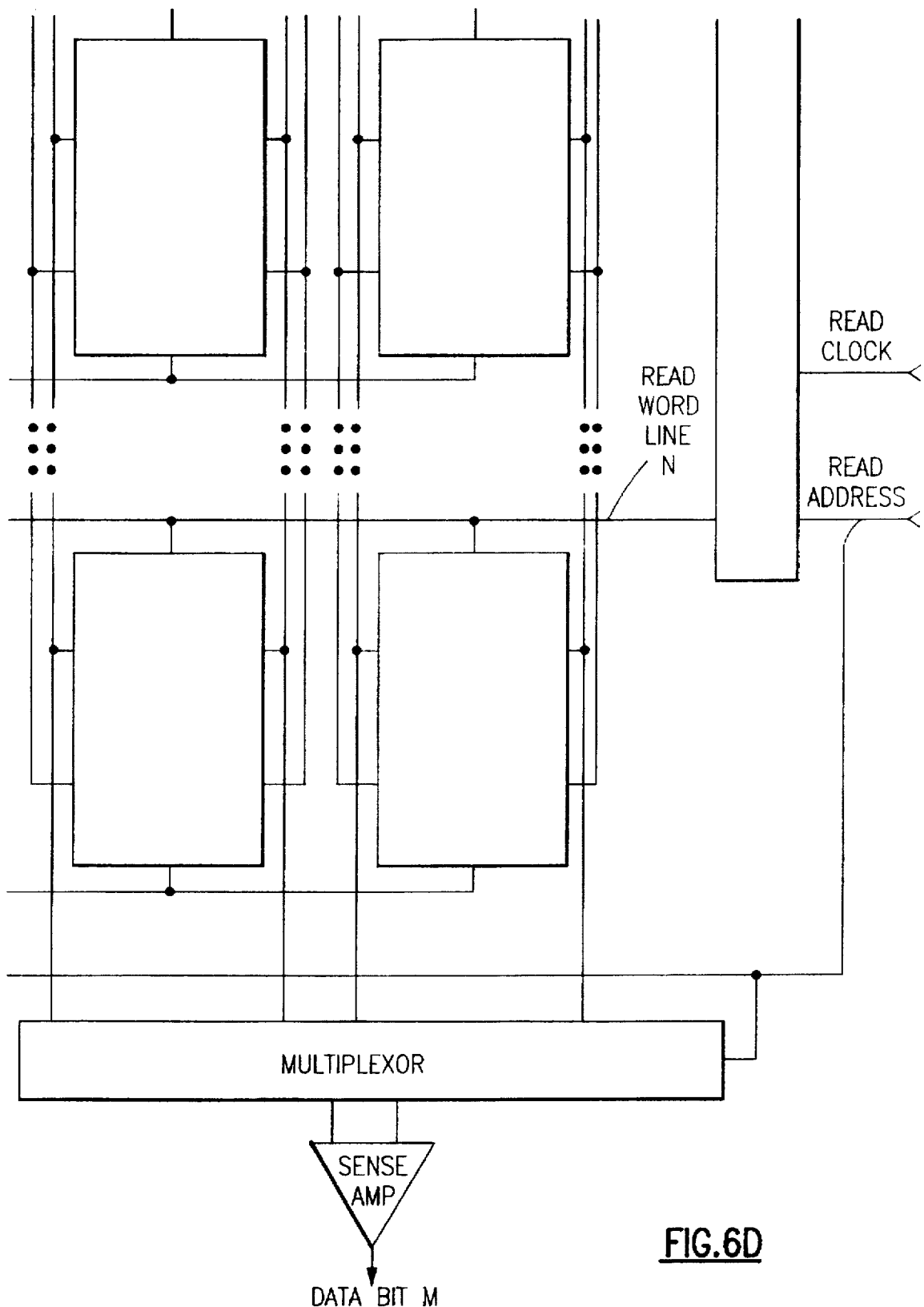

HIGH DENSITY TWO PORT SRAM CELL FOR LOW VOLTAGE CMOS APPLICATIONS

BACKGROUND OF THE INVENTION

1. Technical Field of the Invention

This invention pertains to static RAM used for electronic memory. In particular, this invention improves reading/writing of data from/to low voltage, high density SRAM memory cells, thereby providing faster and more reliable memory access and improved I/O performance.

2. Background Art

In high performance two-port static RAM it is often necessary to use a few of the address bits to multiplex the read bit lines that are accessed by a common word line into a single Sense Amplifier. This is done so that wordline length and bitline length can be optimized for maximum performance and density. For example, if a memory has very few bits but many words, the wordline lengths would be very short, but the bitline lengths would be very long. This would result in a slower memory performance because the small devices in the memory cell cannot very quickly switch the high capacitance of a long bitline. A solution which improves performance is to remove a couple of the read address lines from the word decoder, and use them instead to multiplex a number of bit lines into a common sense amplifier. For instance, if two bits are removed from the read decoder address and used for multiplexing, the number of wordlines, and thus the bitline length, would decrease by a factor of four while the wordline length would increase by a factor of four. The reduction in bitline length at the expense of an increase in wordline length often results in an overall improvement in memory performance. However, this use of a few of the read address lines to multiplex between multiple bitlines that are enabled by a common wordline, creates some problems in the write port of two-port arrays.

Whenever some of the read addresses are used for multiplexing multiple bitlines it is desirable to use the same number of Write Address bits to multiplex write data into write bitlines in order to maintain array design simplicity and density. The part of the address used for a write bit select (FIG. 1 shows a single address bit going to the Bit Select Decoder) provides control signals to three-state drivers which either enable data into the write bit lines, or leave them open (usually pre-charged). This approach works well if the read and write addresses generating the wordlines are different.

However, if the same wordline address is applied to both the Read and Write Decoders, but different Bit Select addresses are used, then the read access performance is slowed. This performance degradation results because the Write Wordline is active to the same memory cell as the Read Wordline, but the Write Bitlines to this same memory cell (that is being read) are three-stated. Therefore, during a read the cell will attempt to switch not only the read bitlines but the write bitlines as well. This multiple demand on the switching current results in degraded performance and possibly a functional failure of the array.

It is an object of the invention to provide a reliable memory cell operable at lower voltages.

It is another object of the invention to provide a memory cell with reliable operation when one bit on a write word line is being read while another bit on the same write word line is being written.

It is yet another object of the invention to provide a high density two-port SRAM cell occupying less chip area.

It is yet another object of the invention to provide a write encoding scheme to address memory cells implemented with the present invention.

SUMMARY OF THE INVENTION

A preferred embodiment of this invention includes an electronic memory apparatus made up of a number of memory cells selectively addressable for read or write operations by word lines and bit lines. Each memory cell includes a latch circuit for storing a data bit which is accessible by the word and bit lines mentioned for retrieving or for storing a data bit therein.

The word lines and bit lines control access to each cell and, in turn, are controlled by read and write decoders, multiplexors, selectors, and drivers for accessing selected memory cells. Memory cells are coupled to these control lines via a series of switches implemented by transistors coupled to the write word lines. A transistor with its source grounded is gated by a write wordline signal. The drain of this transistor is coupled to the sources of a pair of transistors. The drain of one of the pair is coupled to the true data node of the latch, and the drain of the other of the pair of transistors is coupled to the complement data node of the latch.

Write data encoding for each memory cell is implemented via a set of two-input AND gates coupled to data input circuitry and to the write bit lines for controlling write access to selected memory cells.

Other features and advantages of this invention will become apparent from the following detailed description of the presently preferred embodiment of the invention, taken in conjunction with the accompanying drawings.

BEST MODE FOR CARRYING OUT THE INVENTION

Figure 1A:
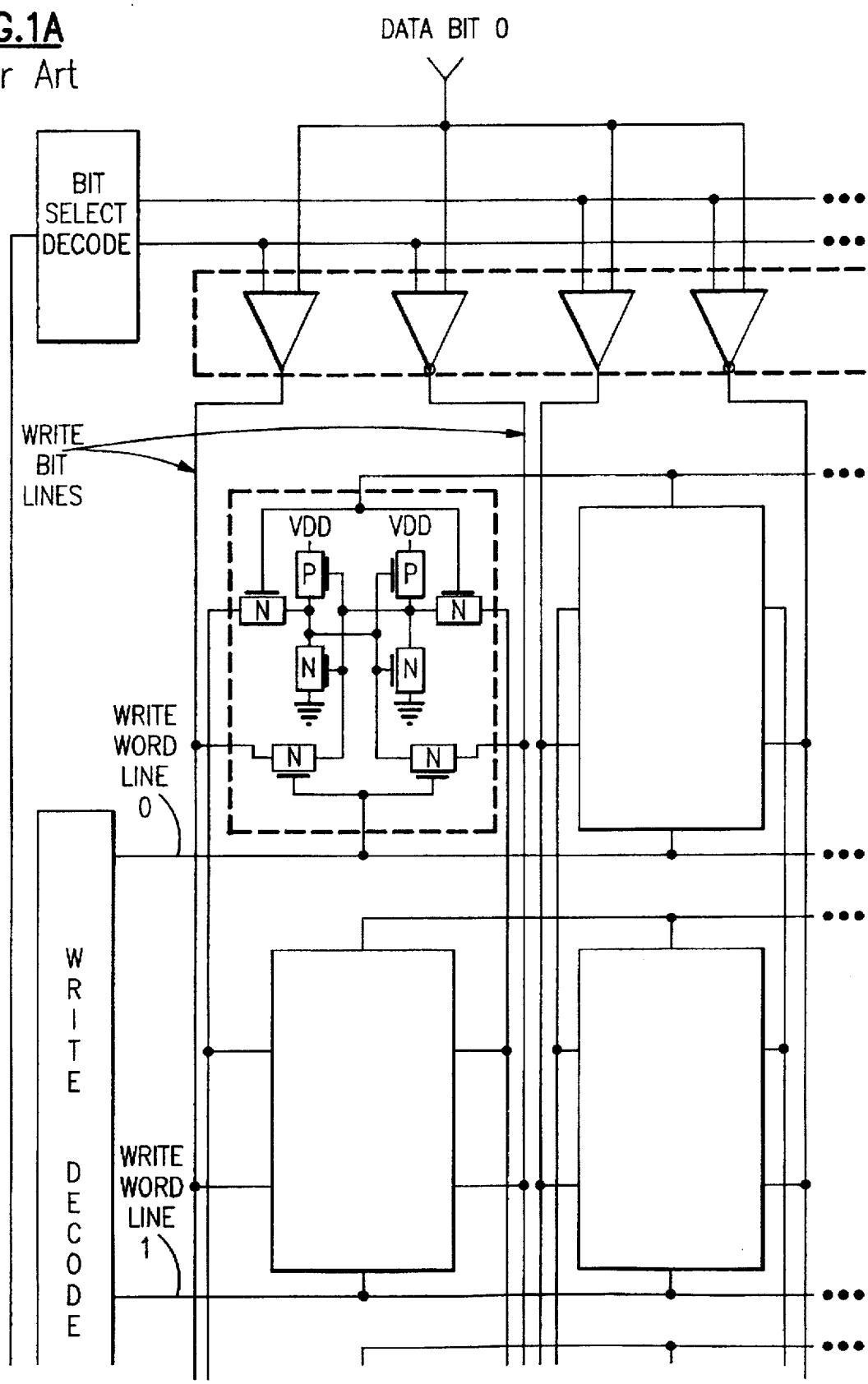
FIG. 1 illustrates a prior art two-port SRAM using differential read and write and shows the use of a portion of read address lines to multiplex bit lines into a common sense amplifier.
Figure 1B:
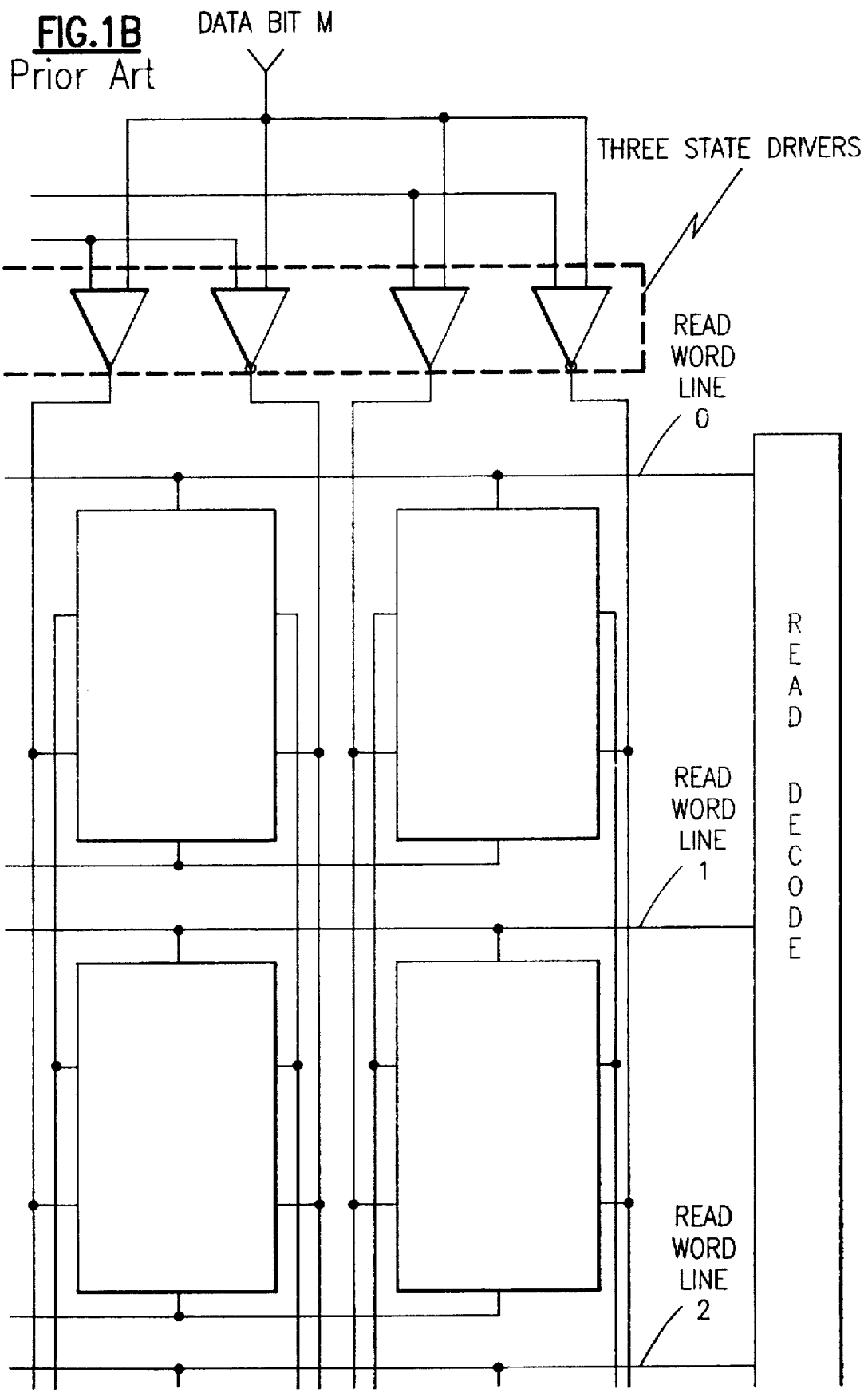
Figure 1C:
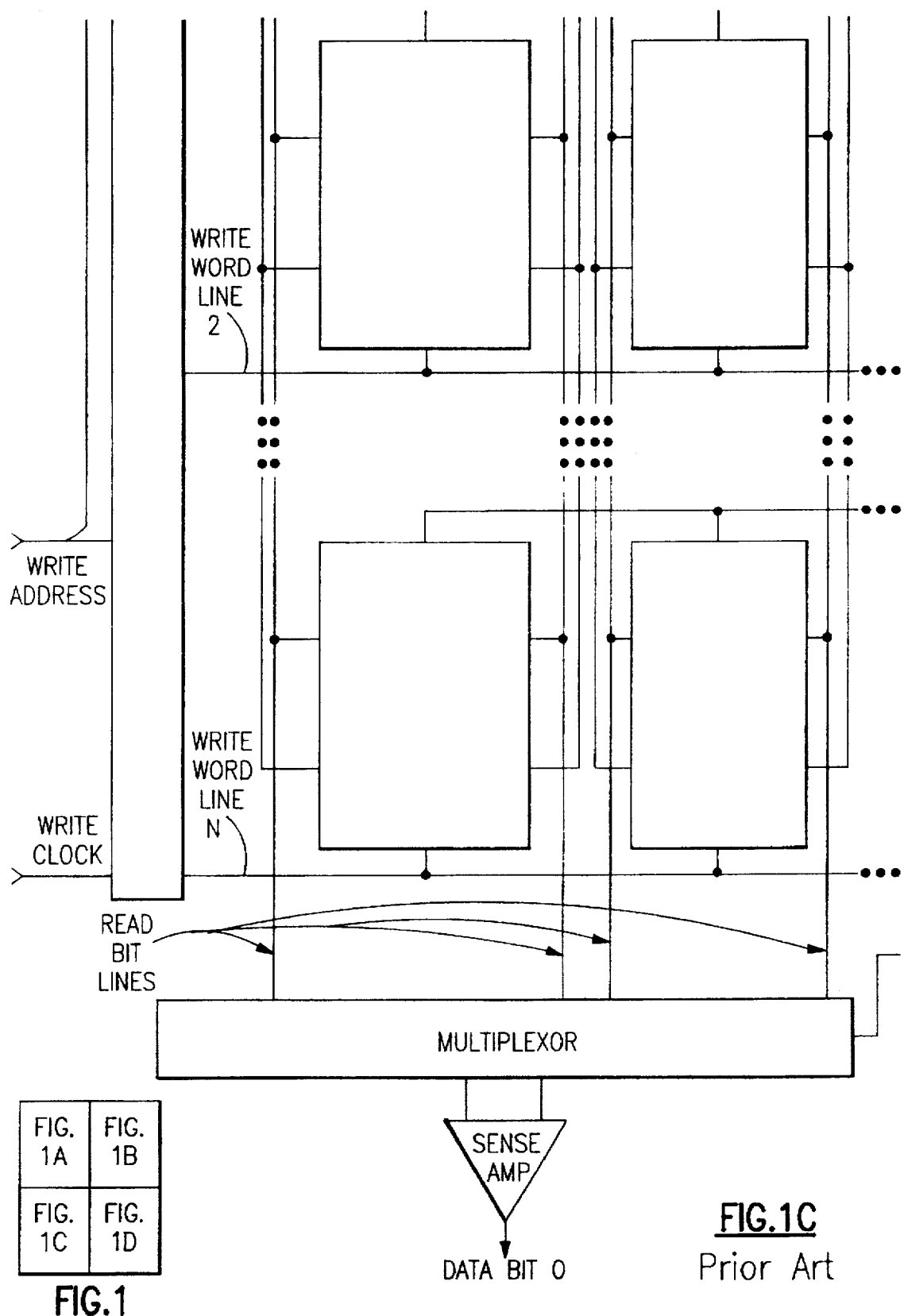
Figure 1D:
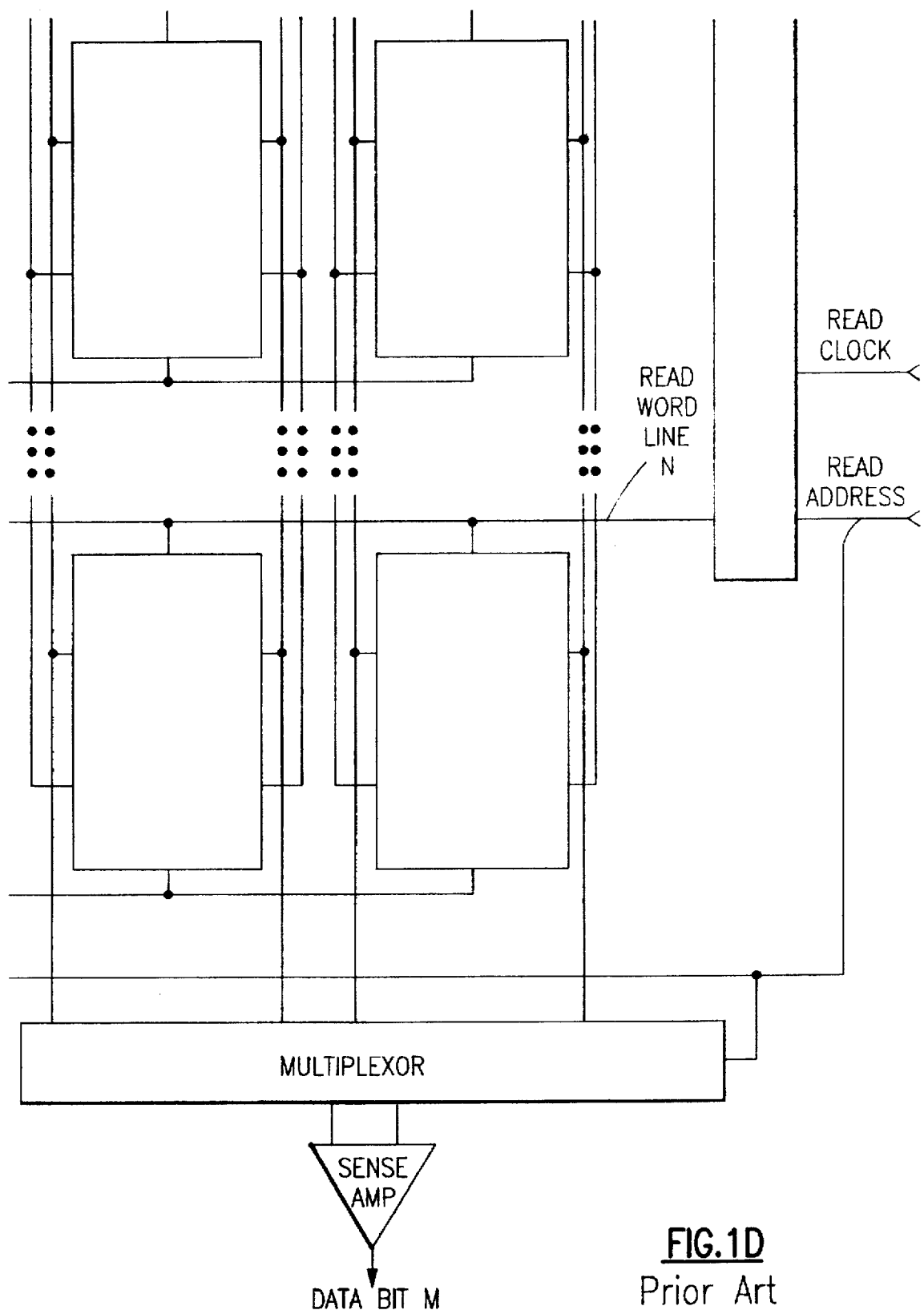
Figure 2:
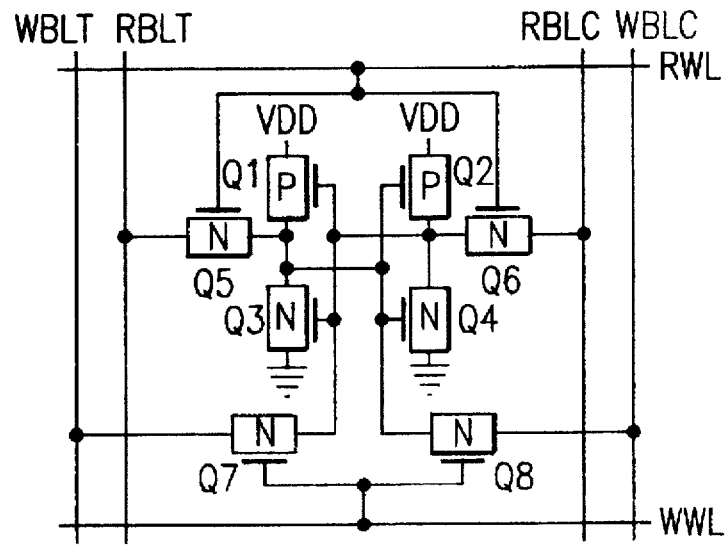
FIG. 2 illustrates an expanded view of the memory cell outlined in dashed lines in FIG. 1.

Referring to FIG. 2, which shows the two-port RAM cell outlined by broken lines in FIG. 1, RBLT and RBLC are the True and Complement Read BitLines, respectively; WBLT and WBLC are the True and Complement Write BitLines, respectively; WWL is the Write WordLine, and RWL is the Read Wordline. Q1, Q2, Q3, and Q4 form the latching function for storing a datum within the RAM cell. Q5 and Q6 are the Read switches controlled by RWL that connect the latch to the true and complement read bit lines for transmitting a stored datum. Q7 and Q8 are the Write switches controlled by WWL that connect the write bit lines to the latch for receiving a datum to store. It can be seen from FIG. 2 that if both the read and write wordlines (RWL and WWL) are both at logical "1" that the latch must switch both the read bitlines and write bitlines simultaneously if the write bitlines are not active because they have been three-stated, i.e., floating, by the write bit select decoder (FIG. 1). This multiple demand on the latch output current results in slower performance and a possible data error.

Figure 3:
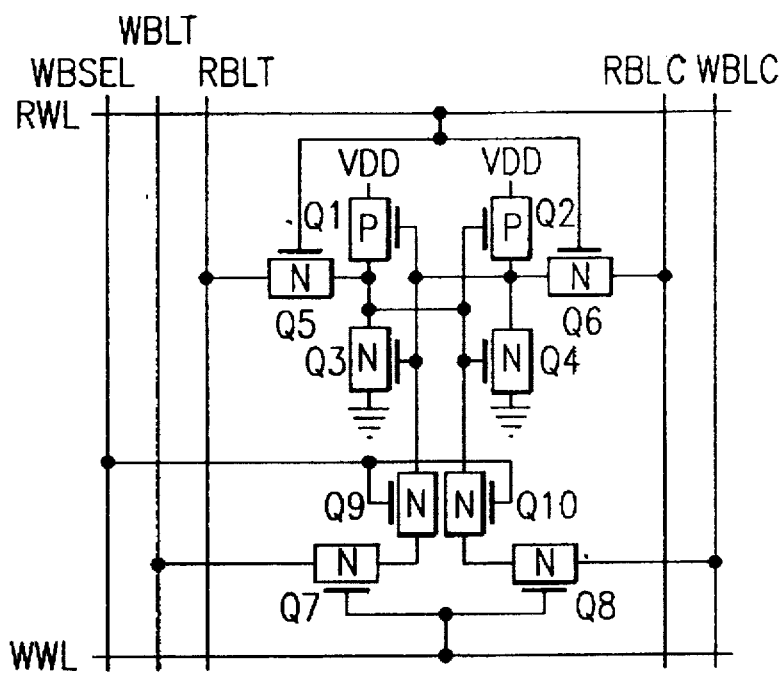
FIG. 3 illustrates a prior art alternative design to the circuit of FIG. 2.

One way to solve this performance problem is illustrated in the embodiment of FIG. 3. In this case the write bit select is not used as in FIGS. 1 and 2 to three-state the write bit lines, instead, an additional line from the Write Bit Select is used to gate "ON" an extra pair of transistors, Q9 and Q10, when the Write Bit Select is active. There are three disadvantages to this approach. First, an additional wire for each column must be provided which distributes the Write Bit Select signals to the cells. Second, the physical size of the RAM must grow in order to accommodate the two additional transistors, Q9 and Q10 inside each memory cell. Third, since Q9 and Q10 are in series with Q7 and Q8, respectively, the size of transistors Q7, Q8, Q9, and Q10 must each increase in order to have a sufficiently low "ON" resistance to switch the latch. Thus, every memory cell would also increase in size and occupy additional valuable chip space.

Figure 4:
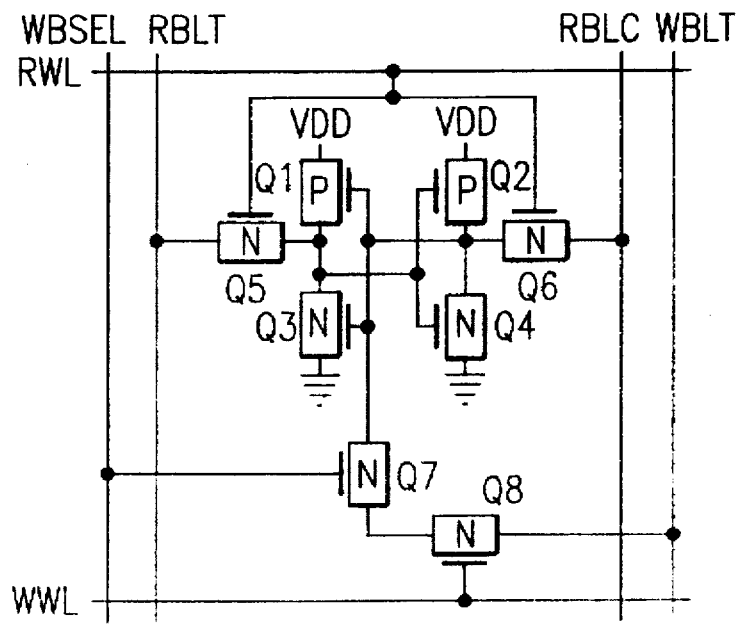
FIG. 4 illustrates a second prior art alternative design for the circuit of FIG. 2.

Referring to FIG. 4, another alternative exists which avoids the problems with the extra wire and two extra devices for the cell of FIG. 3. The WBLC is replaced by the WBSEL (Write Bit Select) line. This still provides a method of gating "OFF" the Write Bit Line from the latch when the Write Bit Select is inactive without adding additional transistors or control lines. However, to write a logical "1" to this cell, Q7 and Q8 must be very much larger than Q3 for the following reasons.

In the memory cell designs discussed above (FIGS. 2 and 3) either the true or complement Write Bit Line would be a logical "0" and would only have to overcome the PFET transistors Q1 or Q2. Since PFET transistors have inherently less gain than NFET transistors and since the gain of the NFET transistor is highest when the source is at Ground (logic 0 state), the devices Q7 through Q10 (FIG. 3) could remain relatively small. However, in FIG. 4, the Q7 and Q8 devices must be able to switch the latch when the WBLT (coupled to Q8) is a logical "1" (supply $V_{dd}$). This uses the Q7 and Q8 NFET transistors in a source follower mode where the gain of the devices is much lower, is highly dependent on the supply voltage, and where a higher current is needed to switch the latch because of the inherently higher gain of the NFET transistor Q3 compared to the PFET transistor Q1. The result is that the two-port cell design shown in FIG. 4 improves the read access performance compared to FIG. 2 at the expense of slower write performance, and the inability to write the cell at low supply voltages. Solving this write problem requires Q7 and Q8 to be increased in size such that at the desired supply voltage the source follower current through Q7 and Q8 is greater than source grounded current of Q3. Thus, the overall size of a memory using the cell design of FIG. 4 would be as large as one using the design of FIG. 3.

Figure 5:
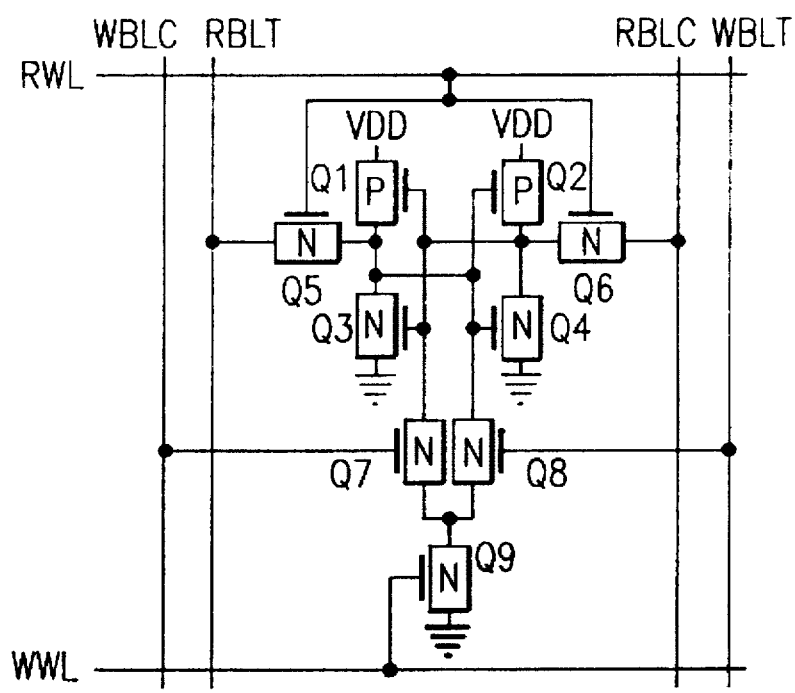
FIG. 5 illustrates the inventive memory cell circuit design of the present invention.
Figure 6A:
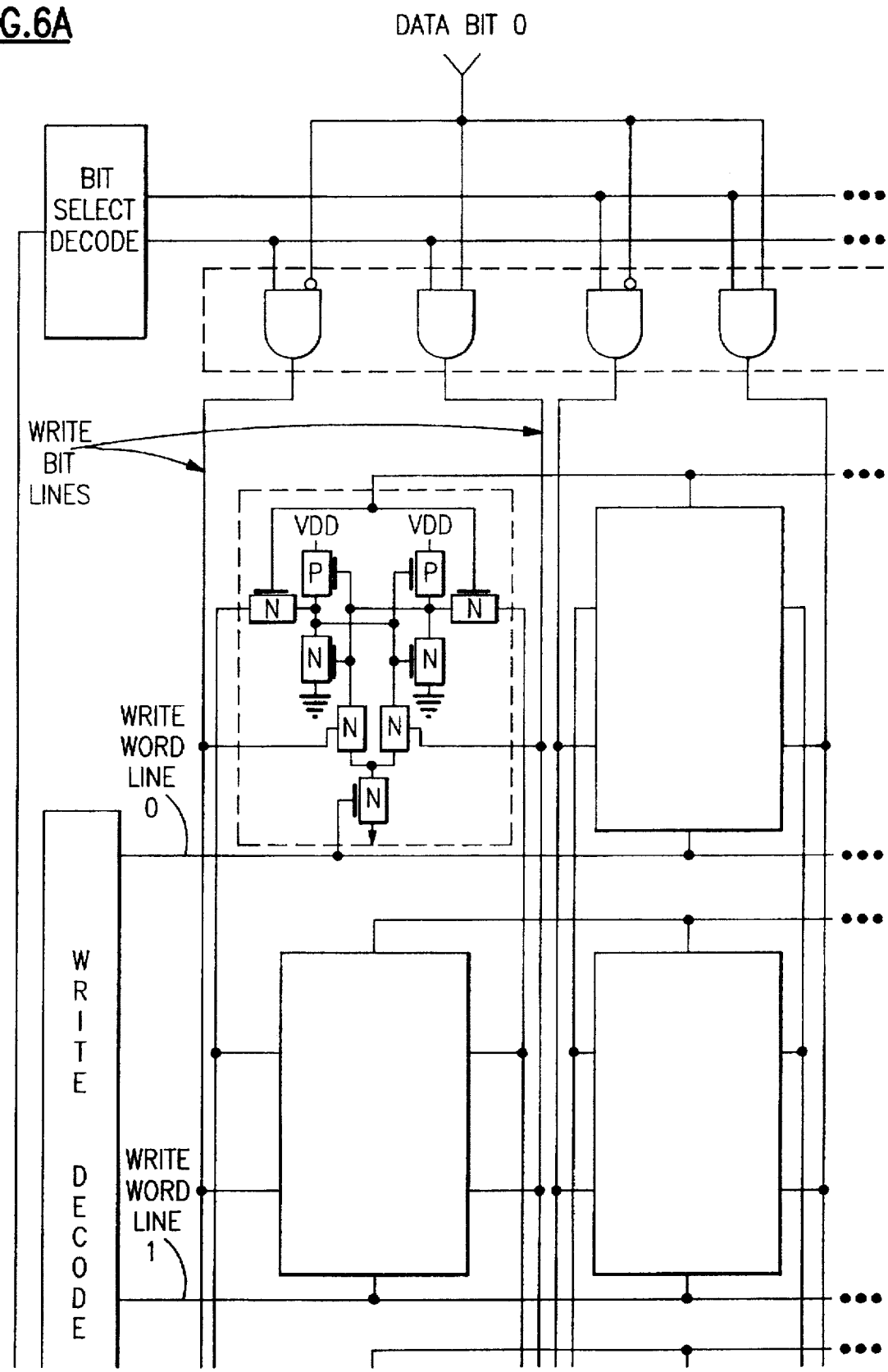
FIG. 6 illustrates an implementation of the memory cell circuit of FIG. 5 in an SRAM with write data encoding implemented via two-way ANDs.
Figure 6B:
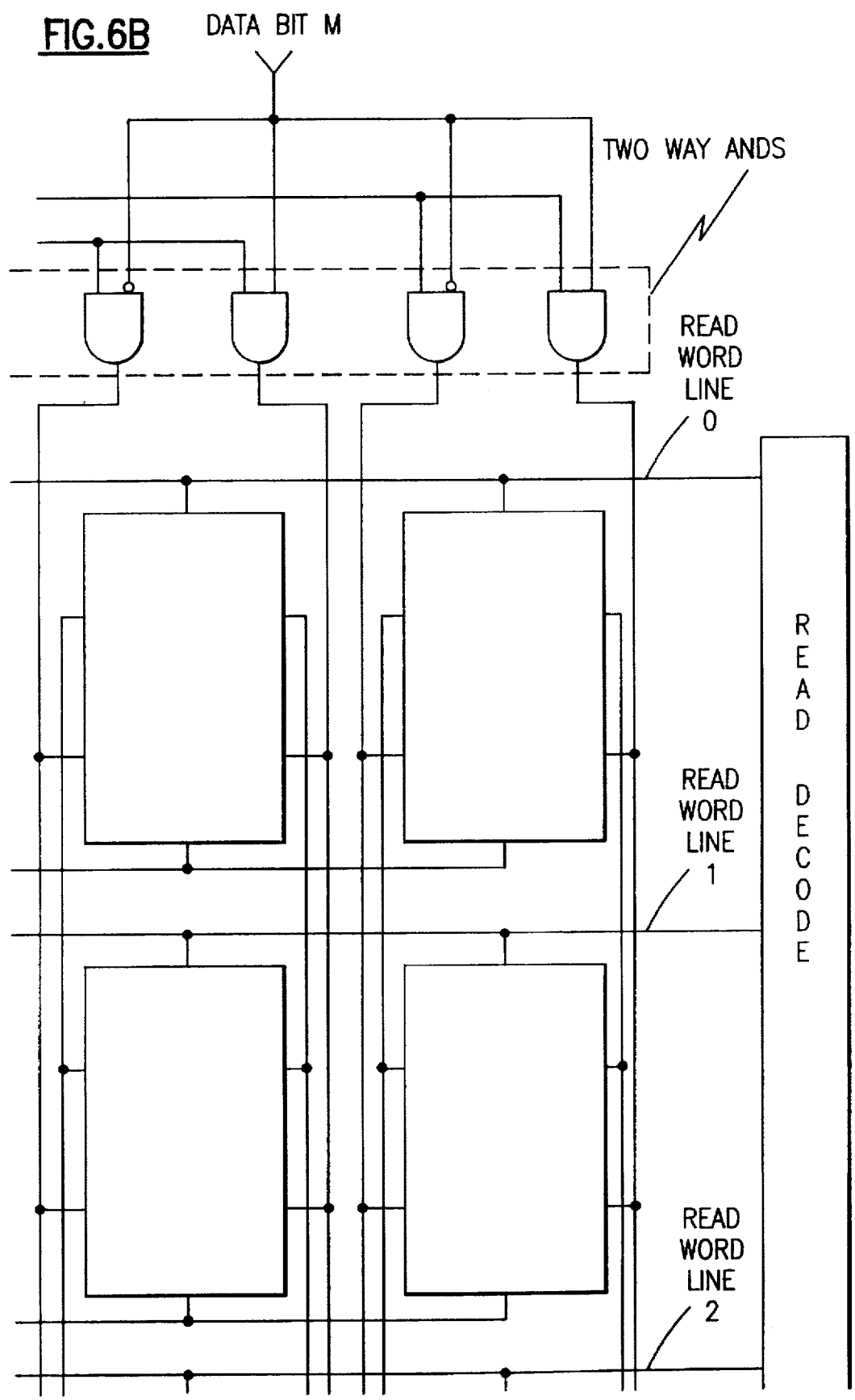
Figure 7:
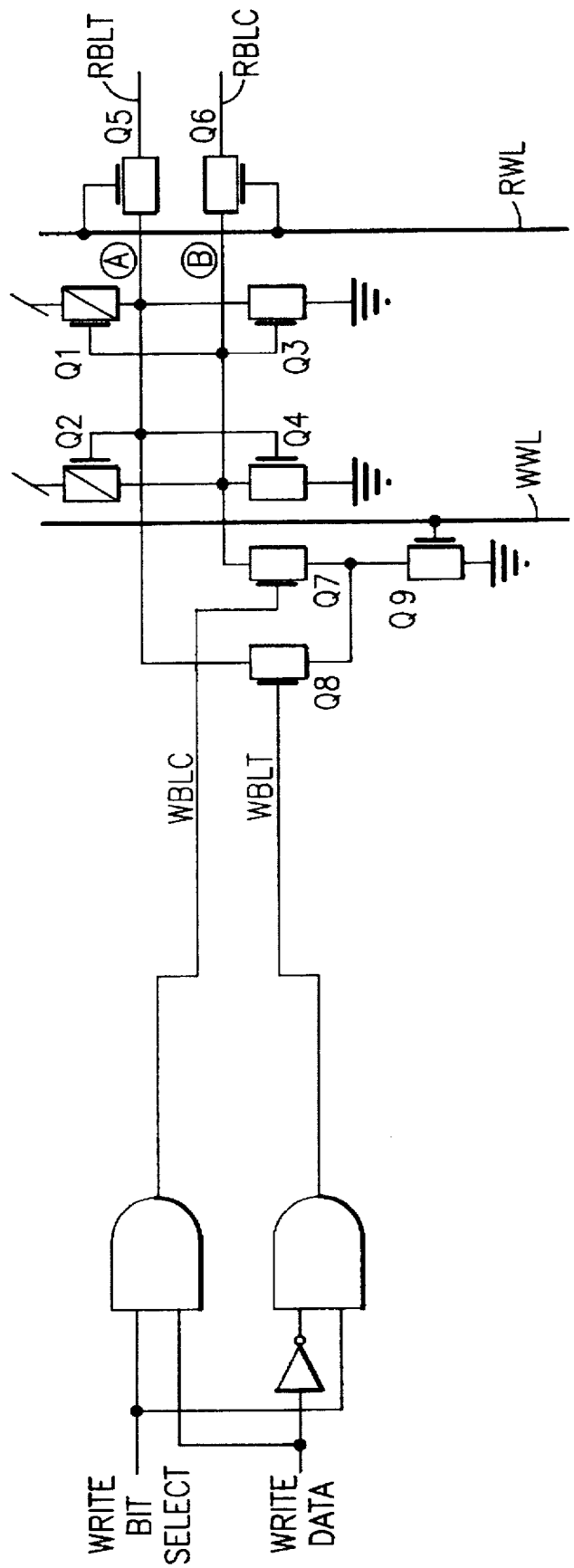
FIG. 7 illustrates the memory cell design of FIG. 5 coupled to the write data encoding circuit shown at the top of FIG. 6 (two-way ANDs).

FIGS. 5 and 7 show equivalent cell schematics and FIG. 6 shows the memory system diagram of the present invention which solves the read performance problems of FIG. 2, but without the extra wire problems of FIG. 3 or the problems of slow write times and inability to operate at low voltages of FIG. 4. This is achieved by providing one additional transistor inside the cell, Q9, and by adjusting usage of the WBLT and WBLC lines coupled to the cell.

Referring to FIG. 6, the Three-State Drivers of FIG. 1 (top) have been replaced with Two-Input ANDs. Thus, instead of the Write Bit Lines being open (floating) as in FIG. 1 when the Write Bit Select is a logical "0", the Write Bit Lines are held to a logical "0" state in FIG. 6 when the Write Bit Select is a logical "0". This shuts off both Q7 and Q8 in FIG. 5 when the Write Bit Select is a logical "0". When the Write Bit Select and Write Wordline are both a logical "1" then Q9 and either Q7 or Q8 are enabled (turned on). If WBLC is a logical "1" then Q7 is turned on and Q8 is off (WBLT is the complement of WBLC). If WBLC is a logical "0", Q7 is turned off and Q8 is on. This creates a path from the latch node to ground which writes the latch to the desired state ("1" or "0"). Since the NFET transistors only have to pull a latch node low during a write of the cell, they are working in their highest gain configuration. Therefore, much smaller devices can be used for Q7, Q8, and Q9 compared to the sizes of Q7 and Q8 in the circuit of FIG. 4.

The circuit illustrated in FIG. 5 along with the modified Write Bit Line circuitry of FIG. 6, both illustrated in FIG. 7 as an individual functional cell, was used to fix a problem of operating at low voltages with a two-port array design such as in FIG. 4. A test of the circuit in FIG. 4 resulted in a failure to write a logical "1" into the cell at supply voltages below 3.3 volts for some process conditions of a 3.6 volt half-micron CMOS process. The Q7 and Q8 devices of FIG. 4 used 6 micron wide devices to overcome a 1.4 micron Q3 device. Q7 and Q8 were replaced with Q7, Q8, and Q9 as shown in FIG. 5 to solve the supply voltage problems. Q7 and Q8 were designed at a 1.4 micron width and Q9 was set at 2.0 micron width. The total width of Q7+Q8+Q9 in the FIG. 5 circuit was less than the width of Q7+Q8 in the FIG. 4 implementation.

The FIG. 5 implementation could reliably write either a logical "0" or a logical "1" to the latch with supply voltages as low as 2.0 volts. Furthermore, the time to write the latch in the normal supply range of 3.0 to 3.8 volts was more than 1 nanosecond faster.

Because the sizes of devices Q7, Q8, and Q9 are much smaller than the original Q7 and Q8 devices of the implementation shown in FIG. 4, capacitive loading on both the Write Wordlines and Write Bitlines is greatly reduced (gate capacitance is reduced by over 50%). This provides an added benefit of reducing the power (current) required to write the memory.

ADVANTAGES OVER THE PRIOR ART

The disclosed memory cell circuit implements a design requiring less power to operate, and so provides reliable operation at lower voltages. The combination of switching devices to write data into a memory cell is replicatable for multi-port cell designs. The lower power requirement together with configuration and type of devices used allow implementation of smaller components which occupy less area on an IC chip. The high density RAM provided herein requires a simple modification to prior art write encoding, i.e., AND gates instead of OR gates, for operation. Thus, this implementation provides a higher performance, lower power, and lower voltage operation than any of the prior art implementations.

ALTERNATIVE EMBODIMENTS

It will be appreciated that, although specific embodiments of the invention have been described herein for purposes of illustration, various modifications may be made without departing from the spirit and scope of the invention. For example, this invention is not limited to two-port static RAMs. Multiple write ports can be provided by duplicating FET transistors Q7, Q8, and Q9 for each additional write port. Multiple read ports are created by duplicating Q5 and Q6. Furthermore, improvements in semiconductor technology may uncover an implementation of a new variety of switching devices for use in RAM without straying from the scope of the present invention. Accordingly, the scope of protection of this invention is limited only by the following claims and their equivalents.

We claim:

1. An apparatus, comprising:
 a plurality of memory cells each including latch means for storing a data bit;
 receiving means coupled to each of the memory cells for transmitting data bits to be stored in selected ones of the memory cells, the receiving means comprising write bit lines and a write word line; and
 the memory cells each further including:
  input means having only three transistors for transmitting the data bit from the receiving means to the latch means, wherein only one of said only three transistors is directly connected both to the write word line and to ground.

2. The apparatus according to claim 1, wherein two others of said only three transistors are coupled in parallel both to said only one of the three transistors and to the latch means.

3. The apparatus according to claim 1, further comprising control means for controlling data bit storage, the control means including a pair of AND gates each coupled to a separate one of a pair of said write bit lines and to a decoder for communicating control information to said pair of AND gates, the pair of write bit lines both coupled to a portion of the plurality of memory cells.

4. An electronic memory cell, comprising:
 a latch circuit for storing a data bit;
 a word line and a bit line for providing to the latch circuit the data bit; and
 only one transistor connected directly to the word line and directly to ground for controlling a reception of the data bit.

5. The electronic memory cell according to claim 4 further comprising a second bit line, and a pair of transistors coupled in parallel both to the one transistor and to the latch circuit, one of the pair of transistors further coupled to the bit line and another of the pair of transistors coupled to the second bit line.

6. The electronic memory cell according to claim 5, wherein the one transistor and the pair of transistors are all NFETs.

7. In an electronic memory apparatus comprising a plurality of memory cells, and having write word lines and write bit lines for selectively accessing the memory cells to write data bits thereto, the improvement comprising:
 only one grounded transistor that is both coupled to a memory cell and connected directly to a write word line for coupling the memory cell to the write word line.

8. The improvement of claim 7 wherein the memory cell includes:
 a latch for storing a data bit written thereto; and
 a pair of transistors coupled in parallel both directly to the latch and the grounded transistor.

9. The improvement according to claim 8, wherein the pair of transistors is each further coupled directly to a separate one of the write bit lines.

10. A random access memory, comprising:
 memory cells, each including:
  a latch circuit for storing a datum (0 or 1); and
  an input circuit coupled to the latch circuit for receiving the datum, the input circuit including first, second, and third switching devices, the first and second switching devices coupled in parallel both to the latch circuit and to the third switching device, the third switching device coupled directly to ground;
 write bit lines and write word lines for selectively transmitting data to the memory cells; and
 the first and second switching devices each coupled to a separate one of the write bit lines, the third switching device further coupled directly to a write word line.

11. The apparatus according to claim 1 wherein the write bit lines include a pair of complimentary write bit lines.

12. The apparatus according to claim 2, wherein said two others of said only three transistors are each further coupled to a separate one of the write bit lines.

13. The electronic memory cell according to claim 5 wherein the bit line and the second bit line are complimentary bit lines.

14. The electronic memory cell according to claim 5 further comprising control means for controlling data bit storage, the control means including:
 a pair of AND gates, one of the AND gates coupled to the bit line and another of the AND gates coupled to the second bit line; and
 a decoder for communicating control information to said pair of AND gates.

15. The improvement of claim 7, further comprising control means for controlling data bit storage, the control means including a pair of AND gates each coupled to a separate one of a pair of said write bit lines, the pair of write bit lines both coupled to a same portion of the plurality of memory cells.

16. The random access memory according to claim 10, further comprising control means for controlling data bit storage, the control means including a pair of AND gates each coupled to a separate one of a pair of said write bit lines and to a decoder for communicating control information to said pair of AND gates, the pair of write bit lines both coupled to a same portion of the memory cells.

17. An apparatus, comprising:
 a plurality of memory cells each including latch means for storing a data bit;
 receiving means coupled to each of the memory cells for transmitting data bits to be stored in selected ones of the memory cells, the receiving means comprising write bit lines and a write word line;
 the memory cells each further including:
  input means coupled to the receiving means for transmitting the data bit to the latch means, the input means including an input transistor coupled to the receiving means and to ground; and
 control means for controlling data bit storage, the control means including a pair of AND gates each coupled to a separate one of a pair of said write bit lines, the pair of write bit lines both coupled to a portion of the plurality of memory cells.

18. An apparatus, comprising:
 a plurality of memory cells each including latch means for storing a data bit;
 receiving means coupled to each of the memory cells for transmitting data bits to be stored in selected ones of the memory cells, the receiving means comprising write bit lines and a write word line; and the memory cells each further including:
input means, for transmitting the data bit from the receiving means to the latch means, having an input transistor coupled to the receiving means and directly to ground, and a pair of transistors coupled in parallel both to the input transistor and to the latch means, and the pair of transistors each further coupled directly to a separate write bit line.

* * * * *